US008305808B2

(12) United States Patent
Lin et al.

(10) Patent No.: US 8,305,808 B2
(45) Date of Patent: Nov. 6, 2012

(54) LOW-VOLTAGE EEPROM ARRAY

(75) Inventors: Hsin Chang Lin, Hsinchu County (TW); Chia-Hao Tai, Hsinchu County (TW); Yang-Sen Yen, Hsinchu County (TW); Ming-Tsang Yang, Hsinchu County (TW); Ya-Ting Fan, Hsinchu County (TW)

(73) Assignee: Yield Microelectronics Corp., Hsinchu County (TW)

( * ) Notice: Subject to any disclaimer, the term of this patent is extended or adjusted under 35 U.S.C. 154(b) by 169 days.

(21) Appl. No.: 12/854,989

(22) Filed: Aug. 12, 2010

(65) Prior Publication Data

US 2012/0039131 A1   Feb. 16, 2012

(51) Int. Cl.
*G11C 11/34* (2006.01)
(52) U.S. Cl. ......... 365/185.09; 365/185.06; 365/185.27; 365/185.18
(58) Field of Classification Search ............. 365/185.05, 365/185.06, 185.11, 185.12, 185.16, 185.27, 365/185.09; 714/766
See application file for complete search history.

(56) References Cited

U.S. PATENT DOCUMENTS

| 5,398,202 A * | 3/1995 | Nakamura ............... 365/185.22 |
| 6,310,800 B1 * | 10/2001 | Takahashi ................ 365/185.05 |
| 7,733,693 B2 * | 6/2010 | Ferrant et al. .................. 365/177 |

* cited by examiner

*Primary Examiner* — Douglas King
(74) *Attorney, Agent, or Firm* — Rosenberg, Klein & Lee

(57) ABSTRACT

A low-voltage EEPROM array, which has a plurality of parallel bit lines, parallel word lines and parallel common source lines is disclosed. The bit lines include a first bit line. The word lines include a first word line and a second word line. The common source lines include a first common source line and a second common source line. The low-voltage EEPROM array also has a plurality of sub-memory arrays. Each sub-memory array includes a first memory cell and a second memory cell. The first memory cell connects with the first bit line, the first common source line and the first word line. The second memory cell connects with the first bit line, the second common source line and the second word line. The first and second memory cells are symmetrical and arranged between the first and second common source lines.

7 Claims, 6 Drawing Sheets

LOW-VOLTAGE EEPROM ARRAY

BACKGROUND OF THE INVENTION

1. Field of the Invention

The present invention relates to a memory array, particularly to a low-voltage EEPROM array.

2. Background of the Invention

The CMOS (Complementary Metal Oxide Semiconductor) process has been a common method for fabricating ASIC (Application Specific Integrated Circuit). The nonvolatile memories, such as the flash memory and EEPROM (Electrically Erasable Programmable Read Only Memory), are widely used in electronic products because the data thereinside can be electrically written and erased and because the data thereinside is saved when power is removed.

A nonvolatile memory is programmable, wherein electric charge is stored to vary the gate voltage of the transistors or not stored to keep the original gate voltage of the transistors. In an erase activity of a nonvolatile memory, the stored charge is eliminated to restore the original gate voltage of the transistors. The flash memory has advantages of smaller size and lower cost. However, the flash memory only supports large-area erasion. It is unlikely to erase the data of a specified memory cell of a flash memory, which causes some application inconveniences. EEPROM has a byte-write function and is more convenient than the flash memory. Refer to FIG. 1 and FIG. 2 for the circuit of a single-bit memory cell of EEPROM and the sectional view thereof. Each polysilicon memory cell of EEPROM comprises a memory transistor 10, a selection transistor 12 and a capacitor 13 arranged on the memory transistor 10. Owing to the abovementioned structure, EEPROM has a larger area than a flash memory. Further, the unselected sites need separating by transistors in a bit-erase activity of EEPROM, which increases the cost of EEPROM.

Accordingly, the present invention proposes a low-voltage EEPROM array to overcome the conventional problems.

SUMMARY OF THE INVENTION

The primary objective of the present invention is to provide a low-voltage EEPROM array, which has small area and low cost, and which performs a byte-write function and a byte-erase function with a low voltage.

To achieve the abovementioned objective, the present invention proposes a low-voltage EEPROM array which comprises a plurality of parallel bit lines, parallel word lines and parallel common source lines. The bit lines include a first bit line. The bit lines are parallel to the pluralities of word lines and common source lines. The word lines include a first word line and a second word line. The common source lines include a first common source line and a second common source line. The low-voltage EEPROM array of the present invention also comprises a plurality of sub-memory arrays. Each sub-memory array connects with a bit line, two word lines and two common source lines, and includes a first memory cell and a second memory cell. The first memory cell connects with the first bit line, the first common source line and the first word line. The second memory cell connects with the first bit line, the second common source line and the second word line. The first and second memory cells share a common connection point at the first bit line. The first and second memory cells are symmetrical and arranged between the first and second common source lines.

Both the first and second memory cells function as operation memory cells. One of the operation memory cells is chosen as a selected memory cell. The operation memory cells, which connect with the bit line that the selected memory cell connect with but do not connect with the common source line that the selected memory cell connects with, function as a plurality of parity-bit memory cells. The operation memory cells, which connect with the word line that the selected memory cell connects with, function as a plurality of parity-word memory cells. The rest of the operation memory cells function as unselected memory cells.

Each of the first and second memory cells has a FET. The FET is an n-type FET formed on a p-type substrate or a p-type well. Alternatively, the FET is a p-type FET formed on an n-type substrate or an n-type well.

When the memory cells have n-type FETs, a substrate voltage $V_{subp}$ is applied to the p-type substrate or p-type well where the selected memory cell connects. A first bit voltage $V_{b1}$, a first word voltage $V_{w1}$ a first common source voltage $V_{S1}$ respectively applied to the bit line, the word line and the common source line that the selected memory cell connects with. A second word voltage $V_{w2}$ and a second common source voltage $V_{S2}$ are respectively applied to the word lines and the common source lines that the parity-bit memory cells connect with. A second bit voltage $V_{b2}$ and the first common source voltage $V_{S1}$ are respectively applied to the bit lines and the common source lines that the parity-word memory cells connect with. The second bit voltage $V_{b2}$, the second word voltage $V_{w2}$ and the second common source voltage $V_{S2}$ are respectively applied to the bit lines, the word lines and the common source lines that the unselected memory cells connect with. In a write activity, the abovementioned voltages satisfy the following conditions: $V_{b2}$ is floating; $V_{subp}$ is grounded; $V_{b1}>V_{S1}$, $V_{w1}>V_{S1}$, $V_{b1}>V_{S1}>0$, $V_{b1}>V_{w2}>0$, $V_{b1}>V_{S2}>0$. In an erase activity, the abovementioned voltages satisfy the following conditions: $V_{S1}$ is grounded; $V_{subp}$ is grounded; $V_{b2}$ is floating; $V_{b1}>V_{w2}>V_{w1}\geq 0$, $V_{b1}>V_{S2}>V_{w1}\geq 0$.

When the memory cells have p-type FETs, a substrate voltage $V_{subn}$ is applied to the n-type substrate or n-type well where the selected memory cell connects. In a write activity, the abovementioned voltages satisfy the following conditions: $V_{b1}$ is floating; $V_{subn}>V_{S1}>V_{b1}$, $V_{subn}>V_{S1}>V_{w1}$, $V_{subn}>V_{S2}>V_{b1}$, $V_{subn}>V_{w2}>V_{b1}$. In an erase activity, the abovementioned voltages satisfy the following conditions: $V_{b2}$ is floating; $V_{subn}=V_{S1}\geq V_{w1}>V_{b1}$, $V_{subn}>V_{S2}>V_{b1}$, $V_{subn}>V_{w2}>V_{b1}$.

Below, the embodiments are described in detail in cooperation with the drawings to make easily understood the technical contents, characteristics and efficacies of the present invention.

DETAILED DESCRIPTION OF THE INVENTION

Figure 1:
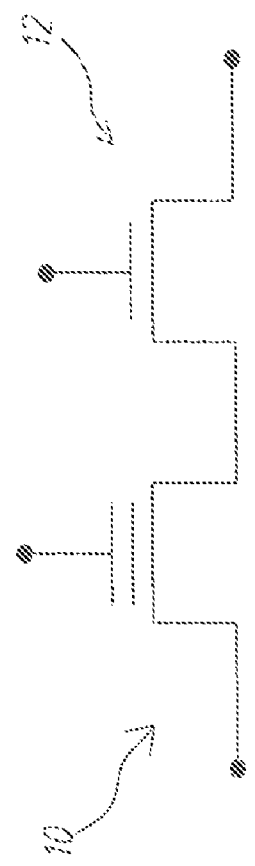
FIG. 1 is a diagram schematically showing the circuit of a single-bit memory cell of a conventional EEPROM.
Figure 2:
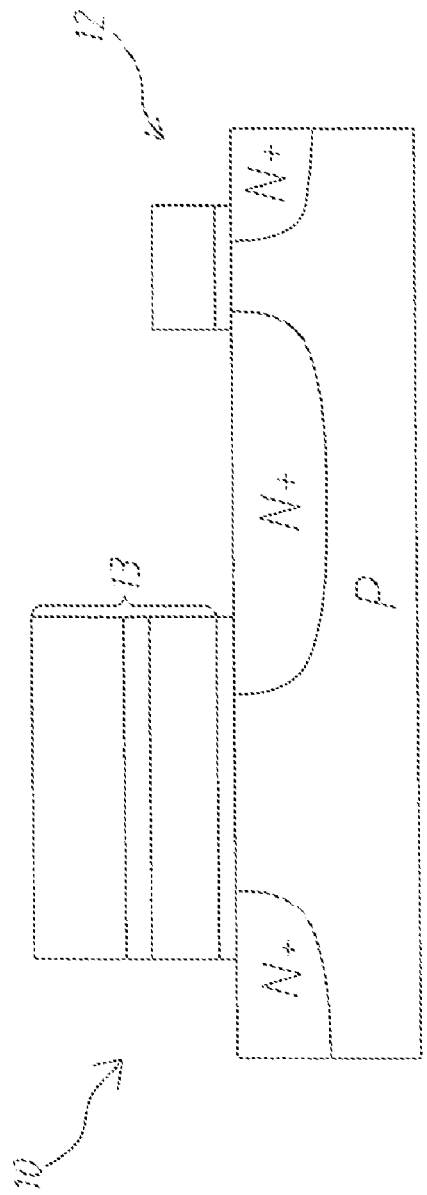
FIG. 2 is a sectional view schematically showing the structure of a single-bit memory cell of a conventional EEPROM.
Figure 3:
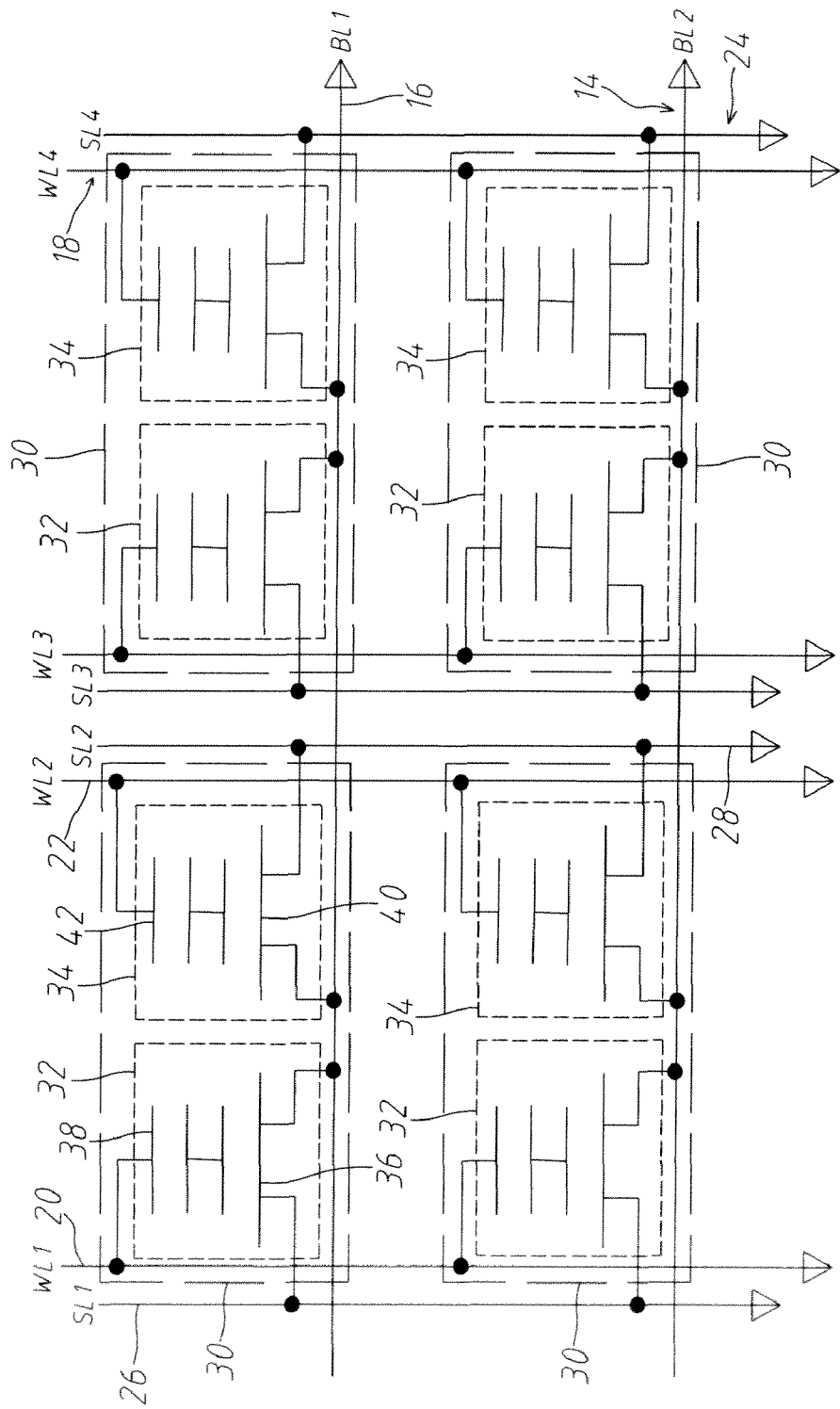
FIG. 3 is a diagram schematically showing the circuit of a low-voltage EEPROM array according to one embodiment of the present invention.
Figure 4:
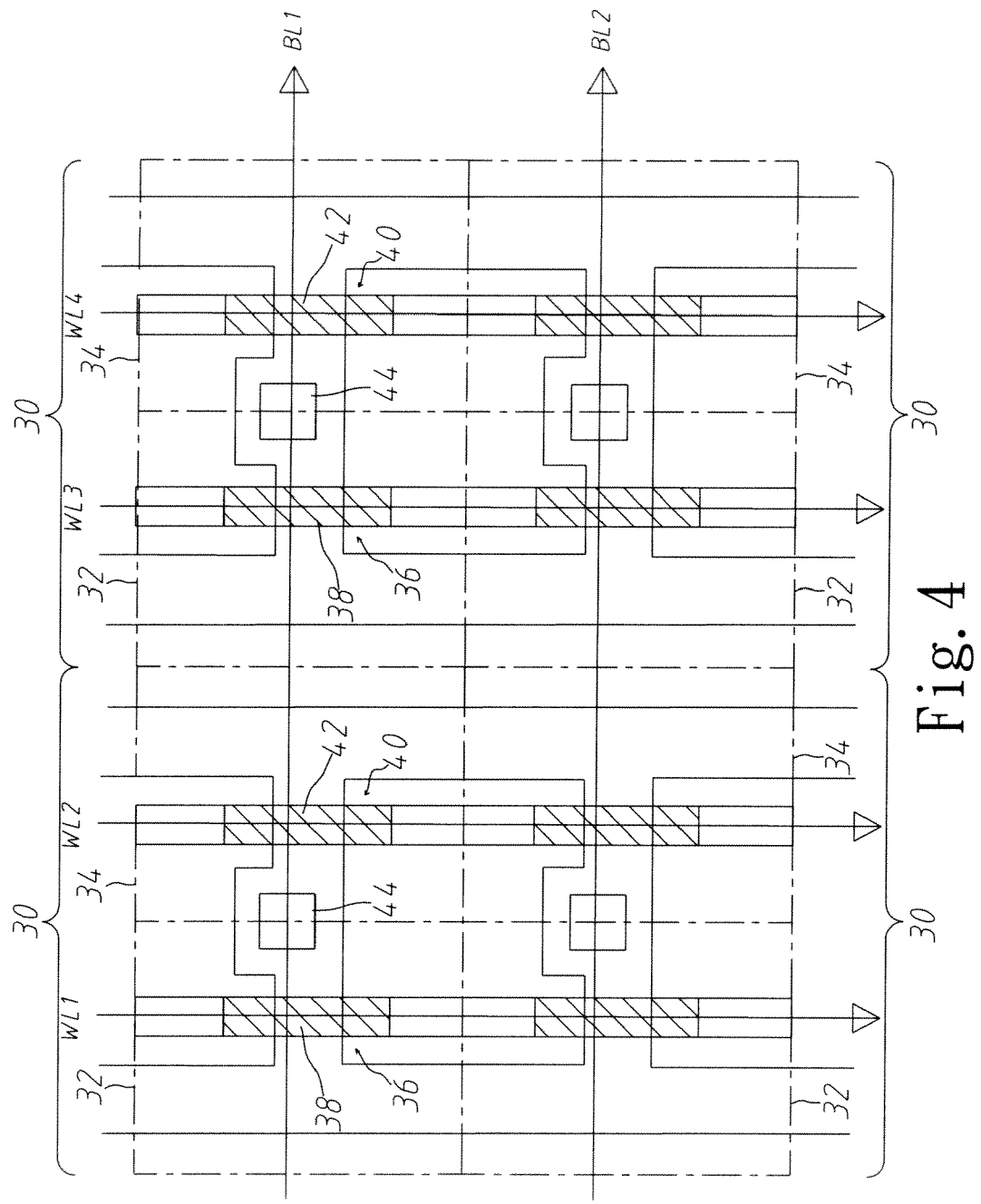
FIG. 4 is a diagram schematically showing the circuit layout of a low-voltage EEPROM array according to one embodiment of the present invention.

Refer to FIG. 3 and FIG. 4. The low-voltage EEPROM array of the present invention comprises a plurality of parallel bit lines 14, including a first bit line 16. The present invention also comprises a plurality of parallel word lines 18 vertical to the bit lines 14, including a first word line 20 and a second word line 22. The present invention also comprises a plurality of parallel common source lines 24 parallel to the word lines 18, including a first common source line 26 and a second common source line 28. The abovementioned bit lines 14, word lines 18 and common source lines 24 connects with a plurality of sub-memory arrays 30, which are 2×1-bit memory cells. Each sub-memory array 30 connects with a bit line 14, two word lines 18 and two common source line 24. The sub-memory cells 30 have very similar connection relationships with the bit lines 14, the word lines 18 and the common source lines 24. The similarity is described below.

Figure 5:
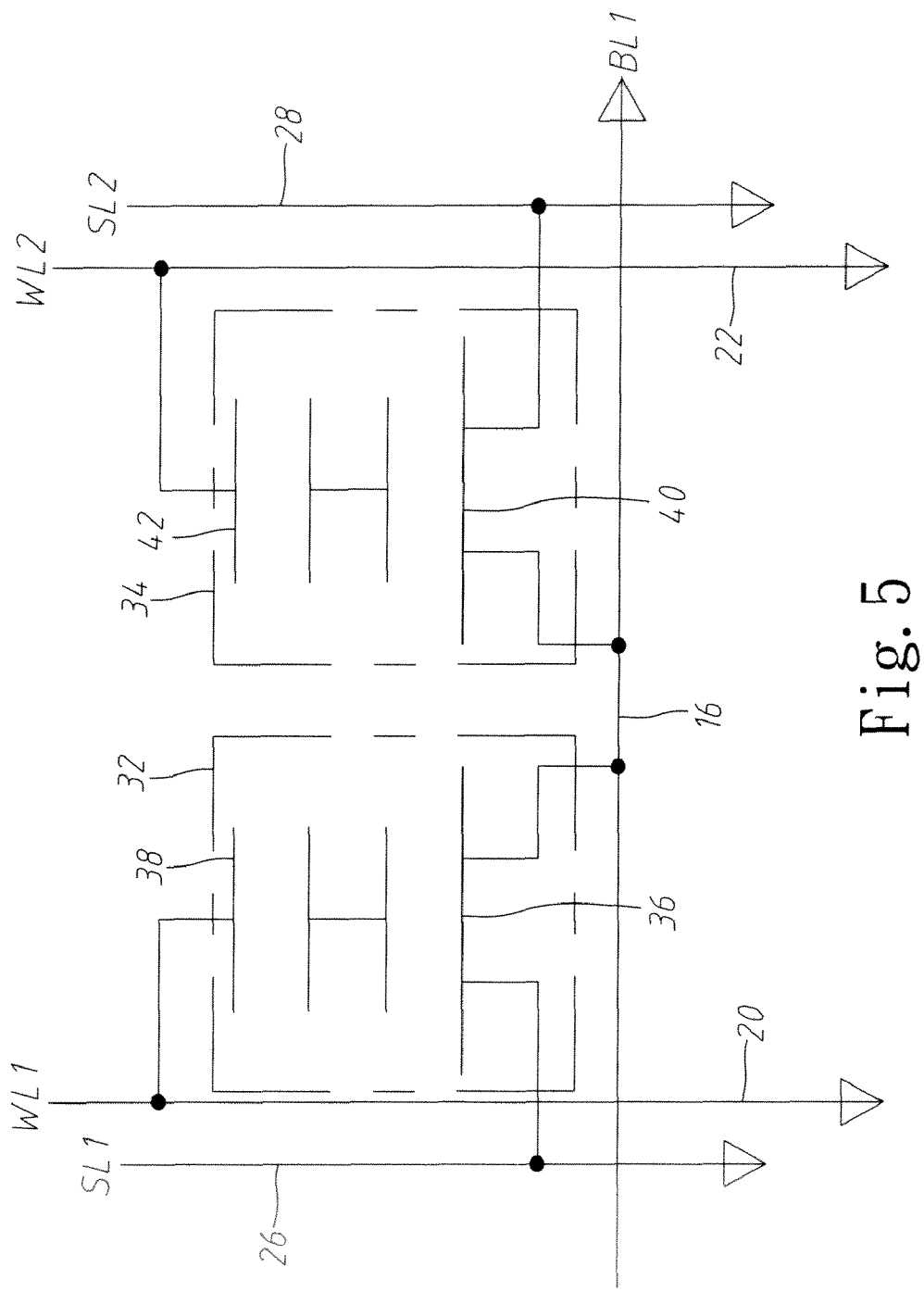
FIG. 5 is a diagram schematically showing the circuit of the sub-memory array of a low-voltage EEPROM array according to one embodiment of the present invention.

Refer to FIG. 4 and FIG. 5. Each sub-memory array 30 further comprises a first memory cell 32 and a second memory cell 34. The first memory cell 32 connects with the first bit line 16, the first word line 20 and the first common source line 26. The second memory cell 34 connects with the first bit line 16, the second word line 22 and the second common source line 28. The first memory cell 32 and the second memory cell 34 are symmetric to each other and arranged between the first common source line 26 and the second source line 28. The first memory cell 32 and the second memory cell 34 do not share the common source lines 24. As both the first memory cell 32 and the second memory cell 34 connect with the first bit line 16, they share a common connection point at the first bit line 16.

The first memory cell 32 includes a FET (Field Effect Transistor) 36 and a capacitor 38. The FET 36 has a floating gate. The drain of the FET 36 connects with the first bit line 16. The source of the FET 36 connects with the first common source line 26. One terminal of the capacitor 38 connects with the floating gate of the FET 36, and the other terminal connects with the first word line 20 to receive the bias voltage of the first word line 20. The FET 36 receives the bias voltages of the first bit line 16 and the first common source line 26 to write data to the floating gate of the FET 36 or erase the data of the floating gate of the FET 36.

The second memory cell 34 includes a FET 40 and a capacitor 42. The FET 40 has a floating gate. The drain of the FET 40 connects with the first bit line 16. The source of the FET 40 connects with the second common source line 28. One terminal of the capacitor 42 connects with the floating gate of the FET 40, and the other terminal connects with the second word line 22 to receive the bias voltage of the second word line 22. The FET 40 receives the bias voltages of the first bit line 16 and the second common source line 28 to write data to the floating gate of the FET 40 or erase the data of the floating gate of the FET 40. The drains of both the FETs 36 and 40 connect with the first bit line 16 and share a drain connection point 44.

Refer to FIG. 3. The FETs 36 and 40 are n-type FETs formed on a p-type substrate or a p-type well. Alternatively, the FETs 36 and 40 are p-type FETs formed on an n-type substrate or an n-type well. In the present invention, the n-type FET and the p-type FET respectively operate in different modes. Below is described the operation mode of the n-type FETs 36 and 40. Each memory cell will be precisely defined for clear explanation.

Both the first and second memory cells 32 and 34 function as operation memory cells. One of the memory cells is chosen as a selected memory cell. The operation memory cells, which connect with the bit line 14 that the selected memory cell connect with but do not connect with the common source line 24 that the selected memory cell connects with, function as a plurality of parity-bit memory cells. The operation memory cells, which connect with the word line 18 that the selected memory cell connects with, function as a plurality of parity-word memory cells. The rest of the operation memory cells function as unselected memory cells.

Via the operation method described below, a specified memory cell is operated without affecting the unselected memory cells.

A substrate voltage $V_{subp}$ is applied to the p-type substrate or p-type well where the selected memory cell connects. A first bit voltage $V_{b1}$, a first word voltage $V_{w1}$ and a first common source voltage $V_{S1}$ respectively applied to the bit line 14, the word line 18 and the common source line 24 that the selected memory cell connects with. A second word voltage $V_{w2}$ and a second common source voltage $V_{S2}$ are respectively applied to the word lines 18 and the common source lines 24 that the parity-bit memory cells connect with. A second bit voltage $V_{b2}$ and the first common source voltage $V_{S1}$ are respectively applied to the bit lines 14 and the common source lines 24 that the parity-word memory cells connect with. The second bit voltage $V_{b2}$, the second word voltage $V_{w2}$ and the second common source voltage $V_{S2}$ are respectively applied to the bit lines 14, the word lines 18 and the common source lines 24 that the unselected memory cells connect with. In a write activity, the abovementioned voltages satisfy the following conditions: $V_{b2}$ is floating; $V_{subp}$ is grounded; $V_{b1} > V_{S1}$, $V_{w1} > V_{b1} > V_{S1} > 0$, $V_{b1} > V_{w2} > 0$, $V_{b1} > V_{S2} > 0$. In an erase activity, the abovementioned voltages satisfy the following conditions: $V_{S1}$ is grounded; $V_{subp}$ is grounded; $V_{b2}$ is floating; $V_{b1} > V_{w2} > V_{w1} \geq 0$, $V_{b1} > V_{S2} > V_{w1} \geq 0$.

When the FETs 36 and 40 are p-type FETs, a substrate voltage $V_{subn}$ is applied to the n-type substrate or n-type well where the selected memory cell connects. In a write activity, the abovementioned voltages satisfy the following conditions: $V_{b2}$ is floating; $V_{subn} > V_{S1} > V_{b1}$, $V_{subn} > V_{S1} \geq V_{w1}$, $V_{subn} > V_{S2} > V_{b1}$, $V_{subn} > V_{w2} > V_{b1}$. In an erase activity, the abovementioned voltages satisfy the following conditions: $V_{b2}$ is floating; $V_{subn} = V_{S1} \geq V_{w1} > V_{b1}$, $V_{subn} > V_{S2} > V_{b1}$, $V_{subn} > V_{w2} > V_{b1}$.

The present invention can achieve the byte-write function and the byte-erase function of the conventional nonvolatile memory via the abovementioned bias voltages without using any isolation transistor.

In a write activity, a charge pump generates a stable high voltage via boosting a voltage of 2.5V or 3.3V and supplies the stable high voltage to the memory cell. However, the voltage drop between the drain and the to source causes a current therebetween and varies the high voltage. The larger the voltage drop, the greater the current, the more powerful the used charge pump, and the greater the layout area. In programming a conventional flash memory, a high voltage is applied to the gate capacitor and the drain; the source is grounded; the current between the drain and the gate is about 500 μA/bit. In programming the memory of the present invention, a high voltage is applied to the gate capacitor and the drain; a medium voltage is applied to the source; the current between the drain and the gate is about 50 μA/bit. The present invention uses a lower voltage and a smaller current in programming the memory and thus has a smaller layout area of the charge pump.

Figure 6:
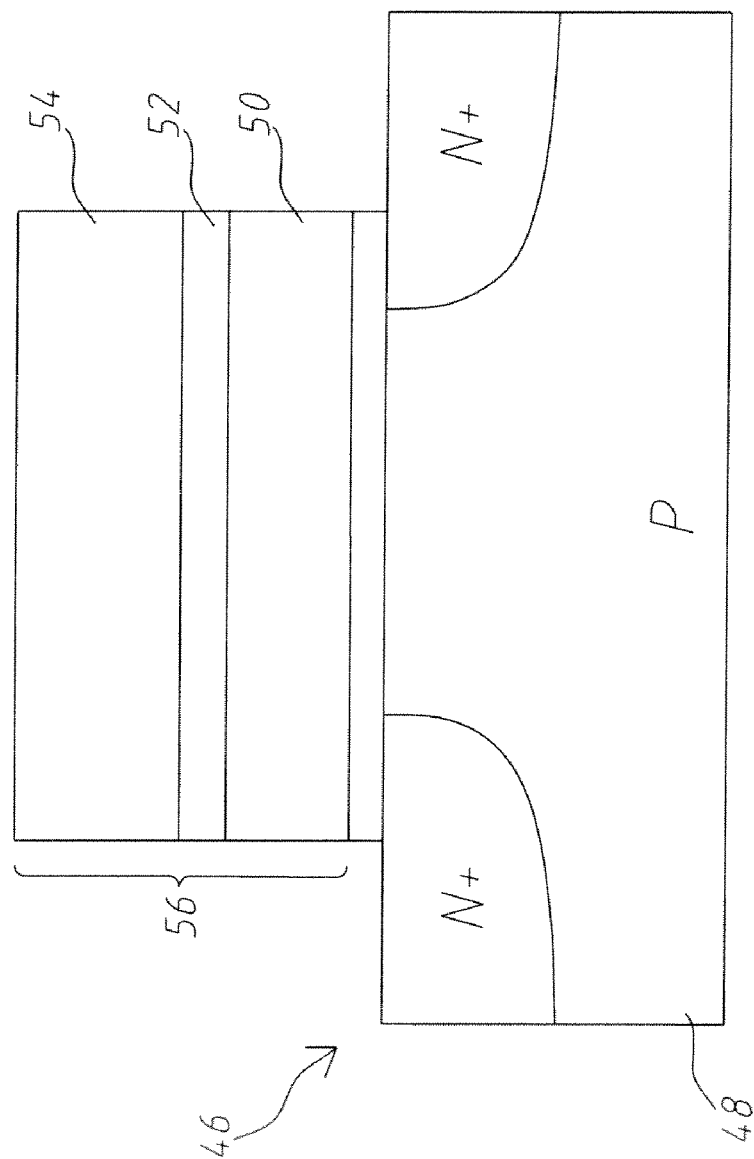
FIG. 6 is a sectional view schematically showing the structure of an n-type FET and a capacitor according to one embodiment of the present invention.
Figure 7:
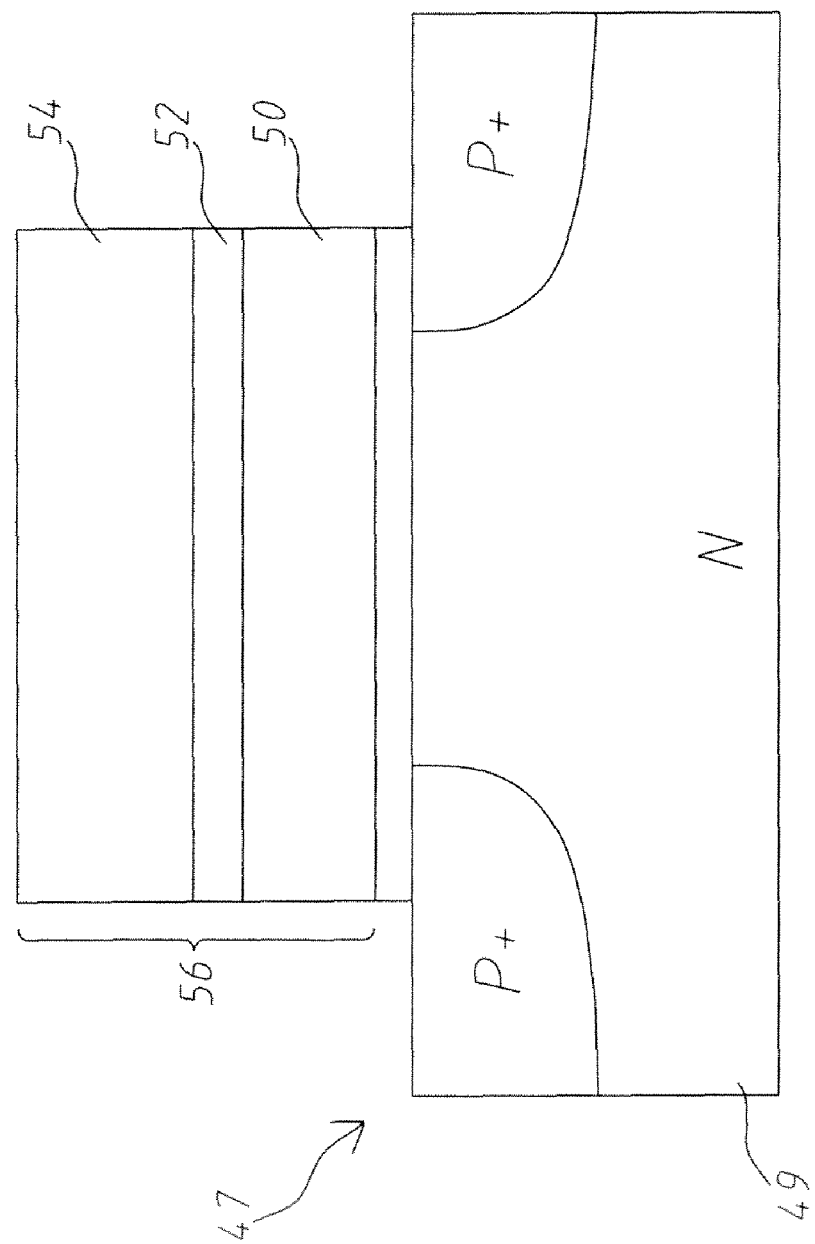
FIG. 7 is a sectional view schematically showing the structure of a p-type FET and a capacitor according to one embodiment of the present invention.

Below are described the structures of the FETs 36 and 40 and the capacitors 38 and 42. An n-type FET is used to exemplify the structures. Refer to FIG. 6. An n-type FET 46 is formed on a p-type semiconductor substrate 48 and has a floating gate 50. An oxide layer 52 and a control gate 54 are sequentially formed above the floating gate 50. The control gate 54, the oxide layer 52 and the floating gate 50 form a capacitor 56. The floating gate 50 and the control gate 54 are made of polysilicon. When the semiconductor substrate is an n-type substrate, a p-type well is formed in the n-type semiconductor substrate, and the n-type FET 46 is formed in the p-type well. If the FET 46 is a p-type FET, the doping types of the source, the drain, the well and the substrate are reversed, as shown in FIG. 7. The memory cell design of the present invention has the architecture of a flash memory. Therefore, the present invention can effectively reduce the area and cost of a nonvolatile memory.

In conclusion, the present invention not only has the advantages of a flash memory architecture smaller area and lower cost, but also has the byte-write function of EEPROM.

The embodiments described above are only to exemplify the present invention but not to limit the scope of the present invention. Any equivalent modification or variation according to the shapes, structures, characteristics and spirit of the present invention disclosed in the specification and claims is to be also included within the scope of the present invention.

What is claimed is:

1. A low-voltage electrically erasable programmable read only memory array, comprising
a plurality of parallel bit lines, including a first bit line;
a plurality of parallel word lines extending substantially perpendicular to said bit lines, including a first word line and a second word line;
a plurality of parallel common source lines parallel to said word lines, including a first common source line and a second common source line; and
a plurality of sub-memory arrays each connecting with one said bit line, two said word lines and two said common source lines, and arranged between two said common source lines, wherein each said sub-memory array includes:
a first memory cell connecting with said first bit line, said first common source line and said first word line; and
a second memory cell connecting with said first bit line and having a common connection point at said first bit line with said first memory cell, and connecting with said second common source line and said second word line, wherein said first memory cell and said second memory cell are symmetrical and arranged between said first common source line and said second common source line,
each of said first and second memory cells having a field effect transistor formed in a substrate or a well,
wherein said first and second memory cells of said plurality of sub-arrays are programmably separated into at least one selected memory cell connected to a respective bit line, a respective word line, and a respective common source line, a plurality of parity-bit memory cells connected with said respective bit line, and disconnected from said respective common source line, a plurality of parity-word memory cells connected with said respective word line, and a plurality of unselected memory cells,
wherein, when each of said first memory cell and said second memory cell has an n-type field effect transistor formed in p-type substrate or a p-type well,
a substrate voltage $V_{subp}$ is a lied to said p-type substrate or said p-type well of said at least one selected memory cell,
first bit voltage $V_{b1}$, first word voltage $V_{w1}$, and a first common source voltage $V_{S1}$ are applied to said respective bit line, said respective word line and said respective common source line, respectively, connected to said selected memory cell,
a second word voltage $V_{w2}$ and a second common source voltage $V_{S2}$ are applied to word lines and common source lines respectively, connected to said plurality parity-bit memory cells, respectively,
a second bit voltage $V_{b2}$ and said first common source voltage $V_{S1}$ are applied to bit lines and common source lines, respectively, connected to said plurality of parity-word memory cells,
said second bit voltage $V_{b2}$, said second word voltage $V_{w2}$, and said second common source voltage $V_{S2}$ are applied to bit lines, word lines and common source lines, respectively, connected to said plurality of unselected memory cells,
wherein said read only memory array operates in a "write" mode and in an "erase" mode,
wherein in the "write" mode:
said $V_{b2}$ is floating, said $V_{subp}$ is grounded, $V_{b1}>V_{S2}$, $V_{w1}>V_{S1}$, $V_{b1}>V_{S1}0$, $V_{b1}>V_{w2}>0$, $V_{b1}>V_{S2}>0$, and
wherein in the "erase" mode:
said $V_{S1}$ is grounded, said $V_{subp}$ is grounded, said $V_{b2}$ is floating, $V_{b1}>V_{w2}>V_{w1}\geqq 0$, and $V_{b2}>V_{S2}>V_{w1}\geqq 0$; and
wherein when each of said first memory cell and said second memory cell has a p-type field effect transistor formed in an n-type substrate or an n-type well,
a substrate voltage $V_{subn}$ is applied to said n-type substrate or said n-type well of said at least one selected memory cell,
a first bit voltage $V_{b1}$, a first word voltage $V_{w1}$, and a first common source voltage $V_{S1}$ are applied to said bit line, said word line, and said common source line respectively, connected to said at least one selected memory cell,
a second word voltage $V_{w2}$ and a second common source voltage $V_{S2}$ are applied to said word lines and said common source lines, respectively, connected to said parity-bit memory cells,
a second bit voltage $V_{b2}$ and said first common source voltage $V_{S1}$ are applied to said bit lines and said common source lines, respectively, connected to said parity-word memory cells,
said second bit voltage $V_{b2}$, said second word voltage $V_{w2}$ and said second common source voltage $V_{S2}$ are applied to said bit lines, said word lines, and said common source lines, respectively, connected to said unselected memory cells,
wherein in the "write" mode: said $V_{b2}$ is floating, $V_{subn}>V_{S1}>V_{b1}$, $V_{subn}>V_{S1}>V_{w1}$, $V_{subn}>V_{S2}>V_{b1}$, $V_{subn}>V_{w2}>V_{b1}$, and
wherein in the "erase" mode:
said $V_{b2}$ is floating, $V_{subn}=V_{S1}\geqq V_{w1}>V_{b1}$, $V_{subn}>V_{S2}>V_{b1}$, and $V_{subn}>V_{w2}>V_{b1}$.

2. The low-voltage electrically erasable programmable read only memory array according to claim 1, wherein said field effect transistor of said first memory cell includes:
a floating gate, wherein a drain of said field effect transistor connects with said first bit line to share said common connection point with said second memory cell, and wherein a source of said field effect transistor connects with said first common source line; and a capacitor, wherein one terminal of said capacitor connects with said floating gate, and wherein another terminal of said capacitor connects with said first word line to receive a bias voltage of said first word line, and wherein said field effect transistor receives bias voltages of said first bit line and said first common source line to write data to said floating gate or erase data of said floating gate.

3. The low-voltage electrically erasable programmable read only memory array according to claim 2, wherein said field effect transistor is an n-type field effect transistor or a p-type field effect transistor.

4. The low-voltage electrically erasable programmable read only memory array according to claim 2, wherein said field effect transistor is formed in a semiconductor substrate, and wherein an oxide layer and a control gate are sequentially formed above said floating gate, and wherein said control gate, said oxide layer and said floating gate form said capacitor, and wherein said floating gate and said control gate are made of a polysilicon material.

5. The low-voltage electrically erasable programmable read only memory array according to claim 1, wherein said field effect transistor of said second memory cell includes:

a floating gate, wherein a drain of said field effect transistor connects with said first bit line to share said common connection point with said first memory cell, and wherein a source of said field effect transistor connects with said second common source line; and a capacitor, wherein one terminal of said capacitor connects with said floating gate, and wherein another terminal of said capacitor connects with said second word line to receive a bias voltage of said second word line, and wherein said field effect transistor receives bias voltages of said first bit line and said second common source line to write data to said floating gate or erase data of said floating gate.

6. The low-voltage electrically erasable programmable read only memory array according to claim 5, wherein said field effect transistor is an n-type field effect transistor or a p-type field effect transistor.

7. The low-voltage electrically erasable programmable read only memory array according to claim 5, wherein said field effect transistor is formed in a semiconductor substrate, and wherein an oxide layer and a control gate are sequentially formed above said floating gate, and wherein said control gate, said oxide layer and said floating gate form said capacitor, and wherein said floating gate and said control gate are made of a polysilicon material.

* * * * *